(12) United States Patent
Yorisue

(10) Patent No.: US 8,043,899 B2
(45) Date of Patent: *Oct. 25, 2011

(54) PHOTOSENSITIVE RESIN COMPOSITION

(75) Inventor: Tomohiro Yorisue, Tokyo (JP)

(73) Assignee: Asahi Kasei E-Materials Corporation, Tokyo (JP)

( * ) Notice: Subject to any disclaimer, the term of this patent is extended or adjusted under 35 U.S.C. 154(b) by 139 days.

This patent is subject to a terminal disclaimer.

(21) Appl. No.: 12/531,803

(22) PCT Filed: Mar. 25, 2008

(86) PCT No.: PCT/JP2008/055518
§ 371 (c)(1),
(2), (4) Date: Sep. 17, 2009

(87) PCT Pub. No.: WO2008/123224
PCT Pub. Date: Oct. 16, 2008

(65) Prior Publication Data
US 2010/0123259 A1    May 20, 2010

(30) Foreign Application Priority Data

Apr. 4, 2007 (JP) ................. 2007-098089

(51) Int. Cl.
*H01L 21/44* (2006.01)
(52) U.S. Cl. ................. 438/124; 257/E23.117
(58) Field of Classification Search ............ 257/791, 257/782–783, 788, 786, 642, 643, E23.117; 438/124, 112, 126–127; 430/270.1, 325; 428/172

See application file for complete search history.

(56) References Cited

U.S. PATENT DOCUMENTS

| 6,984,483 | B1 | 1/2006 | Roscher et al. | |
|---|---|---|---|---|
| 7,674,566 | B2 * | 3/2010 | Shibui | 430/191 |
| 2005/0244658 | A1 | 11/2005 | Bae et al. | |
| 2008/0108723 | A1 * | 5/2008 | Taniguchi et al. | 522/152 |
| 2009/0029287 | A1 | 1/2009 | Kobayashi et al. | |

FOREIGN PATENT DOCUMENTS

| CA | 2 378 756 A1 | 1/2001 |
|---|---|---|
| JP | 63-121043 A | 5/1988 |
| JP | 2005-298800 A | 10/2005 |
| JP | 2007-226209 A | 9/2007 |
| WO | WO-01/04186 A1 | 1/2001 |

* cited by examiner

*Primary Examiner* — Hoa B Trinh
(74) *Attorney, Agent, or Firm* — Birch, Stewart, Kolasch & Birch, LLP

(57) ABSTRACT

A photosensitive resin composition comprising a photosensitive silicone compound of specified molecular weight having any of specified photosensitive substituents and a photopolymerization initiator in any of specified proportions is used. Thus, there can be obtained a resin composition containing a photosensitive silicone compound that provides a material suitable for a rewiring layer or a buffer coat material of LSI chip, less in a film loss between before and after curing and improved in the stickiness of pre-exposure stage. Further, there can be obtained a resin insulating film utilizing the resin composition.

5 Claims, No Drawings

PHOTOSENSITIVE RESIN COMPOSITION

FIELD OF THE INVENTION

The present invention relates to a photosensitive insulating film used in electric and/or electronic materials represented by semiconductor devices and multi-layer wiring board. More specifically, the present invention relates to a photosensitive resin composition for fabricating a patterned insulating film suitable for buffer coat materials and rewiring layer materials of LSI chips and to said insulating film.

BACKGROUND ART

With the performance of LSI becoming more sophisticated, performance demand for insulating materials represented by buffer coat materials and rewiring layer materials for LSI chips is becoming more and more rigorous especially in the characteristics such as high resolution, low temperature cure, low stress and low dielectric constant. Specifically, in order to meet the demand for lower dielectric constants of interlayer insulating film materials, shear stress resistance and heat resistance are becoming weaker, higher speeds are demanded for rewiring layer materials, and, with an increased electric current density, the film of rewiring Cu is becoming thicker. Thus, it has become imperative that, in addition to the conventional high resolution, chemical resistance and temperature stress resistance, upper buffer coat materials and rewiring layers satisfy thick film-forming ability, planarizing ability, low stress, low dielectric constants, and low temperature-curing treatment.

Conventionally, as buffer coat materials and rewiring layer materials for LSI chips, photosensitive polyimides have been used as a representative example. The photosensitive polyimide may be formed by spin-coating a varnish containing a polyimide precursor having a double bond in the side chain and a photopolymerization initiator on an LSI wafer, and then only crosslinking the double bond on the side chain by a photo-crosslinking reaction, which may be developed to form a pattern, and subjected to a thermal curing treatment to decompose and volatilize the crosslinked chain and simultaneously to form a polyimide structure. Polyimides thus formed have excellent heat resistance, chemical resistance, and mechanical resistance.

As problems associated with such photosensitive polyimides, there can be mentioned that cracks may easily occur during thick film formation due to high residual stress, that planarizing ability on unevenness of the wafer top layer is low due to about 40% constriction that may occur during the thermal curing treatment, and that at low temperatures of less than 200° C. during the thermal curing treatment, the formation of a polyimide structure may be difficult and dielectric constant may not lower.

In contrast, Patent document 1 discloses a photosensitive silicone compound designated ORMOCER ONE of Fraunhofer ISC in Germany that may be obtained by the condensation of a trialkoxysilane having a photo-polymerizing functional group and a diarylsilanediol. Said compound may be easily patterned by lithographic exposure and development, and may be thermally cured at a temperature as low as 150° C. Furthermore, the cured product has a heat resistance of 300° C. or higher which is equal to that of polyimides, and simultaneously an excellent characteristics that cannot be attained with photosensitive polyimides as represented by a residual stress of 10 Mpa or less and a film loss of 3% or less between before and after thermal curing. However, it had problems (stickiness) that the stickiness of materials before exposure is great, that when touched to the mask during the exposure work, the materials may stick to the mask (stickiness), and the like.

Also, Patent document 2 discloses an inorganic/organic hybrid oligomer obtained by the condensation of a trialkoxysilane having a photo-polymerizing functional group and diphenylsilanediol using a tetraalkoxytitanium catalyst.

Patent document 1: Canadian patent Publication No. 2378756
Patent document 2: Japanese Unexamined Patent Publication (Kokai) No. 2005/298800

DISCLOSURE OF THE INVENTION

Problems to be Solved by the Invention

The present invention aims to provide a resin composition containing a photosensitive silicone compound that has a small film loss between before and after curing and an improved precuring stickiness, and a semiconductor device using said composition.

Means to Solve the Problems

In efforts to resolve the above problems, the present inventor has found a combination of a photosensitive silicone compound having a weight average molecular weight of 3000 or more and 10000 or less having a specific structure obtained through a first step and a second step described below and a photopolymerization initiator, and thereby has completed the present invention. Thus, the present invention is as follows:

1. A photosensitive resin composition comprising (A) 100 parts by weight of a photosensitive silicone compound described in the following (I), and (B) 0.1-20 parts by weight of a photopolymerization initiator:

(I) A photosensitive silicone compound having a weight average molecular weight of 3000 or more and 10000 or less obtained in a reaction wherein, in a first step, relative to at least one silanol compound (hereinbelow, component (a)) represented by the following general formula (a), at least one compound, as component (b), selected from the group consisting of a compound (hereinbelow component (b1)) represented by the following general formula (b1) and a compound (hereinbelow component (b2)) represented by the following general formula (b2), wherein the content of component (b1) in component (b) is 10% or more to 100% or less in terms of moles, is added at a ratio of (a)/(b)=40 mol %/60 mol % to 60 mol %/40 mol %, and, as a catalyst, one or more than one compound selected from the group consisting of an alkaline earth metal hydroxide, $B(OR^5)_3$, $Al(OR^5)_3$, $Ti(OR^5)_4$, $Zr(OR^5)_4$, $NH_4F$ and $NR^5_4F$ wherein $R^5$ is one or more than one group selected from the group consisting of a $C_1$-$C_{12}$ linear-, a $C_3$-$C_{12}$ branched-, and a $C_3$-$C_{12}$ cyclic-alkyl group is added at a ratio of 0.01-10% by weight relative to the total amount of said component (a) and said component (b), and then are reacted, without positively adding water, to obtain said precondensate, and in a second step, at least one selected from the group consisting of an alkaline metal hydroxide, ammonium hydroxide and tetraalkylammonium hydroxide is added, as a catalyst, at 1-20 mol % relative to the repeating unit of the precondensate synthesized in the first step, and then is condensed, without positively adding water, to obtain said photosensitive silicone compound:

$$R^1{}_2Si(OH)_2 \qquad (a)$$

wherein $R^1$ is one or more than one group selected from the group consisting of a $C_6$-$C_{12}$ aryl group and a $C_7$-$C_{12}$ alkylaryl group, and two $R^1$s may be the same or different;

$$R^2R^3SiX_2 \quad (b1)$$

wherein $R^2$ is a $C_2$-$C_{17}$ organic group comprising at least one group having a carbon-carbon double bond, $R^3$ is a $C_1$-$C_{12}$ hydrocarbon group and X is a $C_1$-$C_{12}$ alkoxy group, and two Xs may be the same or different;

$$R^4{}_aR^3{}_bSiX_{4-a-b} \quad (b2)$$

wherein $R^3$ is a $C_1$-$C_{12}$ hydrocarbon group, $R^4$ is a group selected from the group consisting of a $C_1$-$C_{12}$ linear alkyl group, a $C_3$-$C_{12}$ branched alkyl group, a $C_3$-$C_{12}$ cyclic alkyl group and a fluorine-containing $C_1$-$C_{12}$ hydrocarbon group, and X is a $C_1$-$C_{12}$ alkoxy group, wherein a is an integer selected from 1 and 2, b is an integer selected from 0 and 1, and a+b is 2 or less, and when a is 2, two $R^4$s may be the same or different.

2. The photosensitive resin composition according to the above 1 wherein in the above component (a) $R^1$ is a phenyl group, in the above component (b1) $R^2$ is a 3-(meth)acryloxypropyl group, $R^3$ is a methyl group, and X is a methoxy group or an ethoxy group.

3. A method of forming a cured relief pattern comprising the steps, in sequence, of: coating a photosensitive resin composition according to at least any one of the above 1 and 2 on a substrate to obtain an coated film; irradiating an active beam onto the coated film to light-cure the exposed part; removing the uncured parts of said film using a developing solution; and heating the light-cured film.

4. A cured relief pattern obtained by the method according to the above 3.

5. A semiconductor device comprising the cured relief pattern according to the above 4.

Effect of the Invention

According to the present invention, there can be provided a resin composition containing a photosensitive silicone compound that has a small film loss between before and after thermal curing and improved in the stickiness of preexposure stage, a cured relief pattern obtained therefrom, and a semiconductor device comprising the cured relief pattern.

BEST MODE FOR CARRYING OUT THE INVENTION

The present invention will be explained more specifically hereinbelow.

The photosensitive resin composition of the present invention comprises (A) 100 parts by weight of a photosensitive silicone compound and (B) 0.1-20 parts by weight of a photopolymerization initiator.

(A) A Photosensitive Silicone Compound (A) a photosensitive silicone compound, a component of the composition of the present invention, is a photosensitive silicone compound having a weight average molecular weight of 3000 or more and 10000 or less, and may be synthesized by a method comprising the following two steps:

The first step is a step of obtaining a precondensate, wherein, relative to at least one silanol compound (hereinbelow, component (a)) represented by the following general formula (a), at least one compound, as component (b), selected from the group consisting of a compound (hereinbelow component (b1)) represented by the following general formula (b1) and a compound (hereinbelow component (b2)) represented by the following general formula (b2), wherein the content of component (b1) in component (b) is 10% or more to 100% or less in terms of moles, is added at a ratio of (a)/(b)=40 mol %/60 mol % to 60 mol %/40 mol %, and, as a catalyst, one or more than one compound selected from the group consisting of an alkaline earth metal hydroxide, $B(OR^5)_3$, $Al(OR^5)_3$, $Ti(OR^5)_4$, $Zr(O)R^5)_4$, $NH_4F$ and $NR^5{}_4F$ wherein $R^5$ is one or more than one group selected from the group consisting of a $C_1$-$C_{12}$ linear-, a $C_3$-$C_{12}$ branched-, and a $C_3$-$C_{12}$ cyclic-alkyl group is added at a ratio of 0.01-10% by weight relative to the total amount of said component (a) and said component (b), and then are reacted, without positively adding water, to obtain a precondensate.

The second step is a step of obtaining a photosensitive silicone compound, wherein, at least one selected from the group consisting of an alkaline metal hydroxide, ammonium hydroxide and tetraalkylammonium hydroxide is added, as a catalyst, at 1-20 mol % relative to the repeating unit of the precondensate synthesized in the first step, and condensed, without positively adding water, to obtain said photosensitive silicone compound.

$$R^1{}_2Si(OH)_2 \quad (a)$$

wherein $R^1$ is one or more than one group selected from the group consisting of a $C_6$-$C_{12}$ aryl group and a $C_7$-$C_{12}$ alkylaryl group, and two $R^1$s may be the same or different;

$$R^2R^3SiX_2 \quad (b1)$$

wherein $R^2$ is a $C_2$-$C_{17}$ organic group comprising at least one group having a carbon-carbon double bond, $R^3$ is a $C_1$-$C_{12}$ hydrocarbon group and X is a $C_1$-$C_{12}$ alkoxy group, and two Xs may be the same or different;

$$R^4{}_aR^3{}_bSiX_{4-a-b} \quad (b2)$$

wherein $R^3$ is a $C_1$-$C_{12}$ hydrocarbon group, $R^4$ is a group selected from the group consisting of a $C_1$-$C_{12}$ linear alkyl group, a $C_3$-$C_{12}$ branched alkyl group, a $C_3$-$C_{12}$ cyclic alkyl group and a fluorine-containing $C_1$-$C_{12}$ hydrocarbon group, and X is a $C_1$-$C_{12}$ alkoxy group, wherein a is an integer selected from 1 and 2, b is an integer selected from 0 and 1, and a+b is 2 or less, and when a is 2, two $R^4$s may be the same or different.

In the above component (a) $R^1{}_2Si(OH)_2$, $R^1$ is one or more than one group selected from a $C_6$-$C_{12}$ aryl group and a $C_7$-$C_{12}$ alkylaryl group, and two $R^1$s may be the same or different. As substituents that can be specifically used as $R^1$, there can be mentioned for example a phenyl group, a tolyl group, a xylyl group, a trimethylphenyl group, and a naphthyl group. Among them, a phenyl group can preferably be used. As such a component (a) described above, diphenylsilane diol may preferably be used.

In component (b1) $R^2R^3SiX_2$ among the above component (b), $R^2$ is a $C_2$-$C_{17}$ organic group comprising at least one group having a carbon-carbon double bond, $R^3$ is a $C_1$-$C_{12}$ hydrocarbon group and X is a $C_1$-$C_{12}$ alkoxy group. Two Xs may be the same or different. As substituents that can be specifically used as $R^2$, there can be mentioned a 3-(meth)acryloxypropyl group, a 2-(meth)acryloxyethyl group and a 2-(meth)acryloxymethyl group. Among them, a 3-(meth)acryloxypropyl group can preferably be used. As substituents that can be specifically used as $R^3$, there can be mentioned for example a methyl group, an ethyl group and a propyl group. Among them, a methyl group can preferably be used. As substituents that can preferably be used as X, there can be mentioned for example a methoxy group, an ethoxy group and a propoxy group. Among them, a methoxy group or an ethoxy group can preferably be used. As such a component (a)

described above, 3-methacryloxypropylmethyl dimethoxysilane, 3-methacryloxypropylmethyl diethoxysilane, 3-acryloxypropylmethyl dimethoxysilane, and 3-acryloxypropylmethyl diethoxysilane may preferably be used.

In component (b2) $R^4_a R^3_b SiX_{4-a-b}$ among the above component (b), $R^3$ is a $C_1$-$C_{12}$ hydrocarbon group, $R^4$ is a group selected from the group consisting of a $C_1$-$C_{12}$ linear alkyl group, a $C_3$-$C_{12}$ branched alkyl group, a $C_3$-$C_{12}$ cyclic alkyl group and a $C_1$-$C_{12}$ fluorine-containing hydrocarbon group, and X is a $C_1$-$C_{12}$ alkoxy group, wherein a is an integer selected from 1 and 2, b is an integer selected from 0 and 1, and a+b is 2 or less.

As substituents that can preferably be used as $R^3$, there can be mentioned for example a methyl group and an ethyl group. As substituents that can preferably be used as $R^4$, there can be mentioned a linear or branched alkyl group such as a methyl group, an ethyl group, a n-propyl group, an isopropyl group, a n-butyl group, an isobutyl group, a n-hexyl group and a n-decyl group, a cyclic alkyl group such as a cyclopentyl group and a cyclohexyl group, a fluorine-containing hydrocarbon group such as a trifluoropropyl group and a tridecafluoro-1,1,2,3-tetrahydrooctyl group. As substituents that can preferably be used as X, there can be mentioned a methoxy group and an ethoxy group. As such a component (b2) that can preferably be used, there can be mentioned for example methyl trimethoxysilane, dimethyl dimethoxysilane, methyl triethoxysilane, ethyl trimethoxysilane, diisopropyl dimethoxysilane, diisobutyl dimethoxysilane, n-octyl trimethoxysilane, n-decyl trimethoxysilane, dicyclopentyl dimethoxysilane, dicyclopentyl diethoxysilane, trifluoropropyl trimethoxysilane, and tridecafluoro-1,1,2,2-tetrahydrooctyl trimethoxysilane.

Component (b1) in component (b) is 10% or more and 100% or less in terms of moles. Preferably it is 50% or more and 100% or less, and more preferably 80% or more and 100% or less.

The above component (a)/component (b) is preferably at a ratio of 40 mol %/60 mol % to 60 mol %/40 mol %, preferably 45 mol %/55 mol % to 55 mol %/45 mol %, more preferably 48 mol %/52 mol % to 52 mol %/48 mol %, and most preferably 50 mol %/50 mol %.

(A) The photosensitive silicone compound can be obtained by the following two-step reaction. Thus, in a first step, as a catalyst, one or more than one compound selected from the group consisting of an alkaline earth metal hydroxide, $B(OR^5)_3$, $Al(OR^5)_3$, $Ti(OR^5)_4$, $Zr(O)R^5)_4$, $NH_4F$ and $NR^5_4F$ wherein $R^5$ is one or more than one group selected from the group consisting of a $C_1$-$C_{12}$ linear-, a $C_3$-$C_{12}$ branched-, and a $C_3$-$C_{12}$ cyclic-alkyl group may be added at a ratio of 0.01-10% by weight relative to the total amount of component (a) and component (b), and then heated, without positively adding water, to reflux at 50° C.-120° C. for 0.1-12 hours, and the resultant alcohol may be evaporated under reduced pressure to obtain a precondensate. As a specific catalyst, titanium tetraisopropoxide may be mentioned.

From the viewpoint of reaction progress, the amount used of the catalyst may preferably be 0.01% by weight or more. From the viewpoint of the mechanical characteristics of the cured film, the amount used of the catalyst may preferably be 10% by weight or less.

Subsequently, in a second step, as a catalyst, at least one selected from the group consisting of an alkali metal hydroxide (e.g. NaOH, KOH), ammonium hydroxide and tetraalkylammonium hydroxide may be added at 1-20 mol %, preferably 2-10 mol %, and more preferably 3-5 mol % relative to the repeating unit of the precondensate synthesized in the first step, and, without positively adding water, heated to reflux at 90° C.-180° C. for 0.5-12 hours under reduced pressure to evaporate the volatile products, or after heating to reflux at 90° C.-180° C. for 0.5-12 hours, the volatile products are evaporated to obtain a photosensitive silicone compound having a weight average molecular weight of 3,000 or more and 10,000 or less. In the second step, the system may be rendered vacuum from the early stage of heating, and alcohol may be evaporated without refluxing.

The repeating unit of the precondensate as used herein means a minimum repeating unit when silanediol, the above component (a), and alkoxysilane, the above component (b), are assumed to be condensed at 1:1, in other words component (a) and component (b) are bound by a dimethanol reaction. For example, when the component (a) is diphenylsilane diol and the component (b) is 3-methacryloxypropylmethyl dimethoxysilane, the repeating unit of the precondensate is as shown in the following Formula 1.

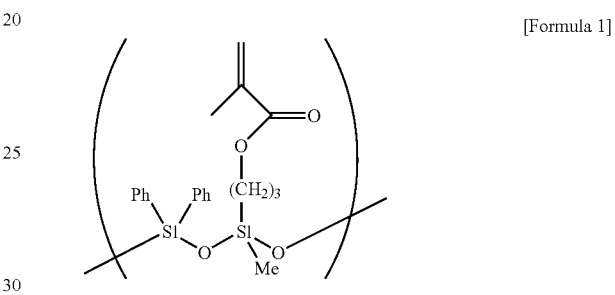

[Formula 1]

In any of the first and second steps, either the reaction may be conducted in the absence of a solvent, or a solvent such as N-methylpyrrolidone, N-ethylpyrrolidone and γ-butyrolactone may be added.

In the above first step, a precondensate having a weight average molecular weight of about 500-2000 may be obtained, and in the second step a precondensate having a weight average molecular weight of about 3000-10,000 may be obtained.

In the second step, when (A) a photosensitive silicone compound having a weight average molecular weight of about 3,000-10,000 is to be synthesized, another alkoxysilane compound, in addition to component (b), in a range not exceeding 10 mol % of component (b) may be added. As specific examples of another alkoxysilane compound, there can be mentioned vinyl trimethoxysilane, 3-methacryloxypropyl trimethoxysilane, 3-methacryloxypropylmethyl dimethoxysilane, 3-methacryloxypropyl triethoxysilane, 3-glycidoxypropyl trimethoxysilane, 3-glycidoxypropylmethyl dimethoxysilane, 3-glycidoxypropyl triethoxysilane, tetramethoxysilane, tetraethoxysilane, methyl trimethoxysilane, dimethyl dimethoxysilane, phenyl trimethoxysilane, and diphenyl dimethoxysilane.

The weight average molecular weight as used herein means a value converted from the elution time of the condensate based on the relational expression of elution time and molecular weight created using gel permeation chromatography (GPC) using a standard polystyrene (TSK Standard Polystyrene manufactured by Tosoh).

The column used was each one of Tosoh's TSKgel 5000HHR, 4000HHR, 3000HHR and 2500HHR arranged in a series. The solvent used was tetrahydrofuran (hereinafter referred to as "THF") at a flow rate of 1 ml/min, the temperature was 40° C., the detector was a UV detector, and the GPC instrument was HLC-8020 manufactured by Tosoh. The molecular weight and product number of the standard polystyrenes (TSK Standard Polystyrene manufactured by Tosoh) used were $5.00\times10^2$ (A-500 (TS-208)), $1.05\times10^3$ (A-1000 (TS-501)), $2.63\times10^3$ (A-2500 (TS-502)), $5.97\times10^3$ (A-5000 (TS-503)), $9.10\times10^3$ (F-1 (TS-203)), $1.81\times10^4$ (F-2 (TS-504)), $3.79\times10^4$ (F-4 (TS-202)), $9.64\times10^4$ (F-10 (TS-144)), $1.90\times10^5$ (F-20 (TS-140)), $3.55\times10^5$ (F-40 (TS-85)), $7.06\times10^5$ (F-80 (TS-201)), and $1.09\times10^6$ (F-128 (TS-206)), and the relationship of elution time and molecular weight was obtained by approximation with a cubic equation to obtain an elution time-molecular weight curve.

(B) The Photopolymerization Initiator

As (B) a photopolymerization initiator that can be used in the present invention, a known photopolymerization initiator, for example, can be mentioned. Specific examples are as follows:

(1) Benzophenone derivatives: For example, methyl o-benzoylbenzoate, 4-benzoyl-4'-methyldiphenyl ketone, dibenzylketone, and fluorenones;

(2) Acetophenone derivatives: For example, 2,2'-diethoxyacetophenone, 2-hydroxy-2-methylpropyophenone, 2,2-dimethoxy-1,2-diphenylethane-1-one (IRGACURE651 manufactured by Ciba Specialty Chemicals Inc.), 1-hydroxycyclohexyl phenylketone (IRGACURE184 manufactured by Ciba Specialty Chemicals Inc.), 2-methyl-1-[4-(methylthio) phenyl]-2-morpholinopropane-1-one (IRGACUR907 manufactured by Ciba Specialty Chemicals Inc.), 2-hydroxy-1-{4-[4-(2-hydroxy-2-methylpropionyl)-benzyl]-phenyl}-2-methylpropane-1-one (IRGACUR127 manufactured by Ciba Specialty Chemicals Inc.), methyl phenylglyoxylate;

(3) Thioxanthone derivatives: For example, thioxanthone, 2-methylthioxanthone, 2-isopropylthioxanthone, diethylthioxanthone;

(4) Benzyl derivatives: For example, benzyl, benzyl dimethylketal, benzyl-β-methoxyethylacetal;

(5) Benzoin derivatives: For example, benzoin, benzoin methylether, 2-hydroxy-2-methyl-1-phenylpropane-1-one (DAROCURE1173 manufactured by Ciba Specialty Chemicals Inc.);

(6) Oxime compounds: For example, 1-phenyl-1,2-butanedione-2-(O-methoxycarbonyl)oxime, 1-phenyl-1,2-propanedione-2-(O-methoxycarbonyl)oxime, 1-phenyl-1,2-prpnedione-2-(O-ethoxycarbonyl)oxime, 1-phenyl-1,2-prpnedione-2-(O-benzoyl)oxime, 1,3-diphenylpropane-trione-2-(O-ethoxycarbonyl)oxime, 1-phenyl-3-ethoxypropanetrione-2-(O-benzoyl)oxime, 1,2-octanedione, 1-[4-(phenylthio)-2-(O-benzoyloxime)] (IRGACURE OXE01 manufactured by Ciba Specialty Chemicals Inc.), ethanone, 1-[9-ethyl-6-(2-methylbenzoyl)-9H-carbazol-3-yl]-1-(O-acetyloxime) (IRGACURE OXE02 manufactured by Ciba Specialty Chemicals Inc.);

(7) α-Hydroxyketone compounds: For example, 2-hydroxy-2-methyl-1-phenylpropane-1-one, 1-[4-(2-hydroxyethoxy)phenyl]-2-hydroxy-2-methyl-1-propane-1-one, 2-hydroxy-1-{4-[4-(2-hydroxy-2-methylpropionyl)-benzyl] phenyl}-2-methylpropane;

(8) α-Aminoalkylphenone compounds: For example, 2-benzyl-2-dimethylamino-1-(4-morpholinophenyl)-butanone-1 (IRGACURE369 manufactured by Ciba Specialty Chemicals Inc.), 2-dimethylamino-2-(4-methylbenzyl)-1-(4-morpholine-4-yl-phenyl)butane-1-one (IRGACURE379 manufactured by Ciba Specialty Chemicals Inc.);

(9) Phosphine oxide compounds: For example, bis(2,4,6-trimethylbenzoyl)-phenylphosphine oxide (IRGACURE819, manufactured by Ciba Specialty Chemicals Inc.), bis(2,6-dimethoxybenzoyl)-2,4,4-trimethyl-pentylphosphine oxide, 2,4,6-trimethylbenzoyl-diphenyl-phosphine oxide (DAROCURE TPO manufactured by Ciba Specialty Chemicals Inc.);

(10) Titanocene compounds: For example, bis($\eta^5$-2,4-cyclopentadiene-1-yl)-bis(2,6-difluoro-3-(1H-pyrrole-1-yl) phenyl)titanium (IRGACURE784 manufactured by Ciba Specialty Chemicals Inc.).

In using them, they may be used alone or in a mixture of two or more than two compounds.

The amount added of a photopolymerization initiator may preferably be 0.1-20 parts by weight and more preferably 1-10 parts by weight relative to 100 parts by weight of (A) the photosensitive silicone compound.

These photopolymerization initiators may be used in combination with a photopolymerization sensitizer. As photopolymerization sensitizers, there can be mentioned, for example, 4,4'-bisethylamino benzophenone, 1-phenyl-1H-tetrazole-5-thiol and 2,2'-(phenyl)mino)diethanol. In using them, they may be used alone or in a mixture of two or more than two compounds. The amount added of a photopolymerization sensitizer may preferably be 1-100 parts by weight and more preferably 1-60 parts by weight relative to 100 parts by weight of (B) the photopolymerization initiator.

(C) Other Components

In accordance with the present invention, compounds having two or more than two photopolymerizing unsaturated binding groups may be added as photopolymerizing monomers.

As photopolymerizing monomers, multifunctional (meth) acryl compounds that can polymerized by the action of a photopolymerization initiator are preferred, and there can be mentioned, for example, polyethylene glycol diacrylate [the number of ethylene glycol units is 2-20], polyethylene glycol dimethacrylate [the number of ethylene glycol units is 2-20], poly(1,2-propylene glycol)diacrylate [the number of 1,2-propylene glycol units is 2-20], poly(1,2-propylene glycol)dimethacrylate [the number of 1,2-propylene glycol units is 2-20], polytetramethylene glycol diacrylate [the number of tetramethylene glycol units is 2-10], polytetramethylene glycol dimethacrylate [the number of tetramethylene glycol units is 2-10], 1,4-cyclohexane diacrylate, 1,4-cyclohexane dimethacrylate, pentaerythritol triacrylate, pentaerythritol tetraacrylate, trimethylolpropane triacrylate, ethoxylated trimethylol propaneacrylate [the number of ethylene glycol units is 2-20], trimethylolpropane trimethacrylate, tri-2-hydroxyethyl isocynurate triacrylate, tri-2-hydroxyethyl isocyanurate trimethacrylate, glycerol dicarylate, glycerol dimethacrylate, ditrimethylolpropane triacrylate, ditrimethylolpropane tetraacrylate, dipentaerythritol pentaacrylate, dipentaerythritol hexaacrylate, methylenebisacrylamide, ethyleneglycol diglycidyl ether-methacrylate adducts, glycerol diglycidyl ether-acrylate adducts, bisphenol A diglycidyl ether-acrylate adducts, bisphenol A diglycidyl ether-methacrylate adducts, ethoxylated bisphenol A diacrylate [the number of ethylene glycol units is 2-30], ethoxylated bisphenol A dimethacrylate [the number of ethylene glycol units is 2-30], and N,N'-bis(2-metharyloyloxyethyl)urea. In using them, they may be used alone or in a mixture of two or more than two compounds. The amount added thereof may preferably be 1-100 parts by weight and more preferably 5-50 parts by weight relative to 100 parts by weight of (A) the photosensitive silicone compound.

In accordance with the present invention, for the purpose of enhancing the adhesion of a photosensitive silicone compound and a substrate, an adhesion adjuvant may be further used. As an adhesion adjuvant that may be used, there can be mentioned, for example, 3-glycidyloxypropyl trimethoxysilane, 3-methacryloxypropyl trimethoxysilane, or 3-acryloxypropyl trimethoxysilane. In using them, they may be used alone or in a mixture of two or more than two compounds. The amount added thereof may preferably be 0.1-20 parts by weight and more preferably 0.2-10 parts by weight relative to 100 parts by weight of (A) the photosensitive silicone compound.

A photosensitive resin composition, for use in the present invention, having the above (A) photosensitive silicone compound and the above (B) photopolymerization initiator as essential components may be produced by co-dissolving them in a solvent such as N-methyl pyrrolidone, N-ethyl pyrrolidone, γ-butyrolactone, and propyl acetate. The solvent used at this time is not specifically limited as long as it can dissolve both of the above (A) photosensitive silicone compound and the above (B) photopolymerization initiator.

(D) A Method of Forming a Cured Relief Pattern

Then, a method of forming a cured relief pattern will be described. The formation of a cured relief pattern at least comprises the steps, in sequence, of: coating a photosensitive resin composition on a substrate to obtain an coated film; irradiating an active beam onto the coated film to light-cure the exposed part; removing the uncured parts of said film using a developing solution; and heating the light-cured film.

Specifically, the photosensitive resin composition obtained as above may be coated using a spin coater, a bar coater, a blade coater, a curtain coater, or a screen printer, or may be spray-coated using a spray coater to obtain a coated film on the substrate. As the substrate as used herein, a silicon wafer or an aluminum-sputted silicon wafer may preferably be used. The thickness of the coated film may preferably be 1-100 μm, and more preferably 2-50 μm.

When a solvent is contained, the coated film obtained may be dried by, for example, air-drying, dry heating with an oven or a hot plate, or vacuum drying.

The coated film thus obtained may be soft-baked at 80-200° C., and then the coated film may be exposed to an ultraviolet light source using, for example, a contact aligner, a mirror projection, or a stepper. In terms of pattern resolution and handling as a light-curing resin, the wavelength of the light source may preferably be the i-beam and the instrument may preferably be a stepper.

Thereafter, for the purpose of enhancing photosensitivity, post-exposure bake (PEB) and/or pre-development bake (pre-bake) may be conducted as needed at the desired combination of temperature and time (preferably at a temperature of 40° C.-200° C. for 10 seconds-360 seconds).

For development, any method may be selected from conventionally known methods of developing photoresists, for example a rotating spray method, a paddle method, and a sonication-associated soaking method.

As developing solutions that may be used, the combination of a good solvent and a poor solvent relative to the above (A) photosensitive silicone compound is preferred. As such a good solvent, there can be used, for example, N-methyl pyrrolidone, N-acetyl-2-pyrrolidone, N,N'-dimethylacetamide, cyclopentanone, cyclohexanone, γ-butyrolactone, α-acetyl-γ-butyrolactone, and propyleneglycol monomethyletheracetate. Also, as such a poor solvent, there can be used, for example, toluene, xylene, methanol, ethanol, isopropyl alcohol, propyleneglycol monomethylether and water. The ratio of the poor solvent to the good solvent may be adjusted depending on the solubility of (A) the photosensitive silicone compound. Each solvent may be used in combination.

After development, a rinse solution may be used for washing, and by removing the developing solution, a relief patterned coated film may be obtained. As a rinse solution, there can be used distilled water, methanol, ethanol, isopropyl alcohol and propylene glycol monomethylether etc. alone or, as appropriate, in a mixture, or in stepwise combination.

In the process of heating the light-cured film, a cured relief patterned substrate may finally be heated to 150° C. or higher and 300° C. or lower to further react the unreacted double bond groups so as to obtain a cured film. The heating temperature may preferably be 150° C. or higher and 250° C. or lower. It is 150° C. or higher from the viewpoint of reaction progress of unreacted double bond groups during heating, and 300° C. or lower from the viewpoint of thermal decomposition. Heating may be conducted with a hot plate, an oven, or a temperature-programmable temperature-rising oven. As an atmospheric gas during heating, air may be used, and an inert gas such as nitrogen and argon may be used. The heating time may preferably be 0.5 hour or longer from the viewpoint of reaction progress of unreacted double bond groups during heating, and 8 hours or shorter from the viewpoint of thermal decomposition.

By using the above-mentioned cured relief pattern as any one selected from the group consisting of a surface protection film, an interlayer insulating film, and an α-beam shielding film and, for the other steps, by applying the known method of producing semiconductor devices, various semiconductor devices can be produced.

EXAMPLES

The present invention will now be explained in further detail with reference to specific examples, but it should be noted that the present invention is not limited to these examples in any way.

Working Example 1

Synthesis of a Photosensitive Silicone Compound

In a first step, 0.5 mole (108.16 g) of diphenylsilane diol, 0.5 mole (116.2 g) of 3-methacryloxypropylmethyl dimethoxysilane, and 0.011 mole (3.13 g) of titanium tetraisopropoxide were fed into a 500 ml eggplant type flask, and then a condenser was equipped thereto. The temperature was gradually raised to 80° C. in an oil bath, and after confirming reflux with ethanol evolving at 80° C., reflux was continued at the same temperature for 1 hour, and then the condenser was removed, and methanol was removed by vacuum-aspiration. To prevent bumping, the degree of vacuum was gradually raised. When it reached about 1-3 torr, vacuum-aspiration was continued under stirring at 80° C., and finally it was returned to ordinary pressure to complete methanol removal, and thus a precondensate was obtained. The standard polystyrene-converted weight average molecular weight of this precondensate measured by GPC was about 989.

In a second step, relative to 100 g (a minimum repeating unit molecular weight 372) of the precondensate obtained, 0.75 g of KOH (5 mol % relative to the molar amount of the minimum repeating unit of the precondensate) was added, and after raising the temperature to 120° C., it was vacuum-aspirated at the same temperature for 1 hour. Thereafter, it was returned to ordinary pressure and after the content was cooled to room temperature, about 25 g of MEK was added to prepare the MEK solution of the polymer. Then the MEK solution of this polymer was filtrated under reduced pressure, and further passed through a cation exchange resin (Amberlyst 15 manufactured by Organo) to remove KOH. At 80° C. the system was vacuated to remove MEK and finally a high molecular weight condensate was obtained. The standard polystyrene-converted weight average molecular weight of this photosensitive silicone compound measured by GPC was 6669.

<Preparation and Stickiness Evaluation of the Photosensitive Resin Composition>

100 parts by weight of the synthesized photosensitive silicone compound, 1 part by weight of IRGACURE369 manufactured by Ciba Specialty Chemicals Inc. as a photopolymerization initiator, 0.2 part by weight of 4,4'-bisethylamino benzophenone as a photopolymerization sensitizer, and 0.2 part by weight of 3-methacryloxypropyl trimethoxysilane as an adhesion adjuvant to the silicon wafer were dissolved in 25 parts by weight of N-methylpyrrolidone under stirring to prepare a varnish.

This varnish was spin-coated onto a silicon wafer having an aluminum layer with a thickness of 2000 angstroms on the surface, which was prebaked at 120° C. for 6 minutes. When a glass mask was placed on the coated side of the photosensitive resin composition and peeled, no attachment of the composition on the glass mask was observed. This was regarded as no stickiness, and was represented by "A" as shown in the following Table 1.

Then, using an i-beam stepper, the entire surface of the resin was exposed to light (exposure 500 mJ/cm$^2$). This was spin-developed using propyleneglycol monomethylether acetate (PGMEA) as the developing solution and isopropyl alcohol (IPA) as the rinse solution, and was further cured under $N_2$ at 180° C. for 3 hours. No film loss was noted between before and after curing. Then this cured film was diced at a width of 3 mm, and the whole wafer was immersed in hydrochloric acid to peel the cured film. The dielectric constant of this cured film was measured with a cavity resonance measuring instrument (AET Inc.) at 10 GHz and was found to be 2.9.

Working Example 2

In a manner similar to Working Example 1, a photosensitive silicone compound was synthesized, and for evaluation, evaluation similar to Working Example 1 was followed except that the composition of 100 parts by weight of this photosensitive silicone compound, 2 parts by weight of 1,3-diphenylpropane trione-2-(O-ethoxycarbonyl)oxime as a photopolymerization initiator, 1 part by weight of 1-phenyl-1H-tetrazole-5-thiol as a photopolymerization sensitizer, 2 parts by weight of 2,2'-(phenylimino)diethanol, and 1.1 part by weight of 4,4'-diethylamino benzophenone, 4 parts by weight of tetraethyleneglycol dimethacrylate as a photopolymerizing monomer, and 4 parts by weight of 3-methacryloxypropyl trimethoxysilane as an adhesion adjuvant to the silicon wafer was used. When a glass mask was placed on the resin side after pre-bake and peeled, no attachment of the composition on the glass mask was observed. This was regarded as no stickiness, and was represented by "A" as shown in the following Table 1. No film loss was noted between before and after curing, and the dielectric constant of this cured film was 2.9.

Working Example 3

Except that KOH in the second step of synthesis of the photosensitive silicone compound was replaced with the same molar amount of NaOH, a photosensitive silicone compound was synthesized in a manner similar to Working Example 1. The weight average molecular weight of this substance measured by GPC (THF solvent) was 5688.

Then, using the photosensitive silicone compound obtained here, a photosensitive resin composition was prepared in a manner similar to Working Example 1, and was evaluated. When a glass mask was placed on the resin side after pre-bake and peeled, no attachment of the composition on the glass mask was observed. This was regarded as no stickiness, and was represented by "A" as shown in the following Table 1. No film loss was noted between before and after curing, and the dielectric constant of this cured film was 2.9.

Comparative Example 1

Except that the precondensate (weight average molecular weight 989) obtained in Working Example 1 was used as it is as the photosensitive silicone compound, a photosensitive silicone compound was synthesized in a manner similar to Working Example 1, and evaluated. When a glass mask was placed on the resin side after pre-bake and peeled, the residual attachment of the composition on the glass mask was observed. This was regarded as stickiness, and was represented by "B" as shown in the following Table 1. No film loss was noted between before and after curing, and the dielectric constant of this cured film was 2.9.

Comparative Example 2

0.5 mole (108.16 g) of diphenylsilane diol, 0.5 mole (124.18 g) of 3-methacryloxypropyl trimethoxysilane, and 0.03 mole (8.53 g) of titanium tetraisopropoxide were fed into a 500 ml eggplant type flask, and then a condenser was equipped thereto. The temperature was gradually raised to 80° C. in an oil bath, and after confirming reflux with methanol evolving at 80° C., reflux was continued at the same temperature for 1 hour, and then the condenser was removed and methanol was removed by vacuum-aspiration. To prevent bumping, the degree of vacuum was gradually raised. When it reached about 1-3 torr, vacuum-aspiration was continued under stirring at 80° C., and finally it was returned to ordinary pressure to complete methanol removal. The weight average molecular weight of this photosensitive silicone compound measured by GPC was 1879.

Then, using the photosensitive silicone compound obtained here, a photosensitive resin composition was prepared in a manner similar to Working Example 1, and was evaluated. When a glass mask was placed on the resin side after pre-bake and peeled, the residual attachment of the composition on the glass mask was observed. This was regarded as stickiness, and was represented by "B" as shown in the following Table 1. No film loss was noted in between before and after curing, and the dielectric constant was 3.1.

The results of Working Examples 1-3 and Comparative Example 1-2 are summarized in Table 1.

TABLE 1

|  | Work. Ex. 1 | Work. Ex. 2 | Work. Ex. 3 | Comp. Ex. 1 | Comp. Ex. 2 |
| --- | --- | --- | --- | --- | --- |
| Raw material alkoxysilane*1 | A | A | A | A | B |
| Weight average MW | 6669 | 6669 | 5688 | 989 | 1879 |
| Stickiness*2 | A | A | A | B | B |
| Dielectric constant | 2.9 | 2.9 | 2.9 | 2.9 | 3.1 |

*1A: 3-methacryloxypropylmethyl dimethoxysilane B: 3-methacryloxypropyl trimethoxysilane
*2"A": When a glass mask was placed on the resin side after pre-bake and peeled, no attachment of the composition on the glass mask was observed. "B": When a glass mask was placed on the resin side after pre-bake and peeled, there was the residual attachment of the composition on the mask side.

INDUSTRIAL APPLICABILITY

The present invention can be favorably used in the field of photosensitive insulating films that are used in electric and/or electronic materials as represented by semiconductor devices and multilayered wiring boards.

The invention claimed is:

1. A photosensitive resin composition comprising (A) 100 parts by weight of a photosensitive silicone compound described in the following (I), and (B) 0.1-20 parts by weight of a photopolymerization initiator:

(I) A photosensitive silicone compound having a weight average molecular weight of 3000 or more and 10000 or less obtained in a reaction wherein, in a first step, relative to at least one silanol compound (hereinbelow, component (a)) represented by the following general formula (a), at least one compound, as component (b), selected from the group consisting of a compound (hereinbelow component (b1)) represented by the following general formula (b1) and a compound (hereinbelow component (b2)) represented by the following general formula (b2), wherein the content of component (b1) in component (b) is 10% or more to 100% or less in terms of moles, is added at a ratio of (a)/(b)=40 mol %/60 mol % to 60 mol %/40 mol %, and, as a catalyst, one or more than one compound selected from the group consisting of an alkaline earth metal hydroxide, $B(OR^5)_3$, $Al(OR^5)_3$, $Ti(OR^5)_4$, $Zr(OR^5)_4$, $NH_4F$ and $NR^5_4F$ wherein $R^5$ is one or more than one group selected from the group consisting of a $C_1$-$C_{12}$ linear-, a $C_3$-$C_{12}$ branched-, and a $C_3$-$C_{12}$ cyclic-alkyl group is added at a ratio of 0.01-10% by weight relative to the total amount of said component (a) and said component (b), and then are reacted, without positively adding water, to obtain said precondensate, and in a second step, at least one selected from the group consisting of an alkaline metal hydroxide, ammonium hydroxide and tetraalkylammonium hydroxide is added, as a catalyst, at 1-20 mol % relative to the repeating unit of the precondensate synthesized in the first step, and then is condensed, without positively adding water, to obtain said photosensitive silicone compound:

$$R^1_2Si(OH)_2 \quad (a)$$

wherein $R^1$ is one or more than one group selected from the group consisting of a $C_6$-$C_{12}$ aryl group and a $C_7$-$C_{12}$ alkylaryl group, and two $R^1$s may be the same or different;

$$R^2R^3SiX_2 \quad (b1)$$

wherein $R^2$ is a $C_2$-$C_{17}$ organic group comprising at least one group having a carbon-carbon double bond, $R^3$ is a $C_1$-$C_{12}$ hydrocarbon group and X is a $C_1$-$C_{12}$ alkoxy group, and two Xs may be the same or different;

$$R^4_aR^3_bSiX_{4-a-b} \quad (b2)$$

wherein $R^3$ is a $C_1$-$C_{12}$ hydrocarbon group, $R^4$ is a group selected from the group consisting of a $C_1$-$C_{12}$ linear alkyl group, a $C_3$-$C_{12}$ branched alkyl group, a $C_3$-$C_{12}$ cyclic alkyl group and a fluorine-containing $C_1$-$C_{12}$ hydrocarbon group, and X is a $C_1$-$C_{12}$ alkoxy group, wherein a is an integer selected from 1 and 2, b is an integer selected from 0 and 1, and a+b is 2 or less, and when a is 2, two $R^4$s may be the same or different.

2. The photosensitive resin composition according to claim 1 wherein in the above component (a) $R^1$ is a phenyl group, in the above component (b1) $R^2$ is a 3-(meth)acryloxypropyl group, $R^3$ is a methyl group, and X is a methoxy group or an ethoxy group.

3. A method of forming a cured relief pattern comprising at least the steps, in sequence, of: coating a photosensitive resin composition according to any one of claim 1 and 2 on a substrate to obtain a coated film; irradiating an active beam onto the coated film to light-cure the exposed part; removing the uncured part of said film using a developing solution; and heating the light-cured film.

4. A cured relief pattern obtained by the method according to claim 3.

5. A semiconductor device comprising the cured relief pattern according to claim 4.

* * * * *